United States Patent
Lee et al.

(10) Patent No.: US 6,977,207 B2
(45) Date of Patent: Dec. 20, 2005

(54) METHOD FOR FABRICATING DUAL-GATE SEMICONDUCTOR DEVICE

(75) Inventors: Chang Yeol Lee, Seoul (KR); Myeong Kook Gong, Kyoungki-do (JP)

(73) Assignee: Hynix Semiconductor Inc., Kyoungki-do (KR)

( * ) Notice: Subject to any disclaimer, the term of this patent is extended or adjusted under 35 U.S.C. 154(b) by 107 days.

(21) Appl. No.: 10/744,428

(22) Filed: Dec. 22, 2003

(65) Prior Publication Data
US 2004/0266114 A1 Dec. 30, 2004

(30) Foreign Application Priority Data
Jun. 30, 2003 (KR) ............... 10-2003-0043910

(51) Int. Cl.⁷ .......................................... H01L 21/425
(52) U.S. Cl. ................... 438/529; 438/514; 438/527
(58) Field of Search ........................ 438/514, 527, 438/529, 585

(56) References Cited

U.S. PATENT DOCUMENTS

| | | | |
|---|---|---|---|
| 6,362,055 B2 * | 3/2002 | Lin et al. | 438/275 |
| 6,387,784 B1 * | 5/2002 | Chong et al. | 438/585 |
| 6,734,070 B1 * | 5/2004 | Takahashi | 438/300 |

* cited by examiner

Primary Examiner—Christian D. Wilson
(74) Attorney, Agent, or Firm—Ladas & Parry LLP

(57) ABSTRACT

A method for fabricating a dual-gate semiconductor device is disclosed. The method A method for fabricating a dual-gate semiconductor device, the method comprising the steps: forming field oxide films defining an active region and a field region on a semiconductor substrate; forming a polysilicon layer on the semiconductor substrate having the field oxide films formed therein; forming a first photoresist pattern on the semiconductor substrate such that a portion of the polysilicon layer placed on the active region between the field oxide films is exposed; performing a first N⁺ ion implantation process in the polysilicon layer using the first photoresist pattern as a mask; removing the first photoresist pattern; forming a second photoresist pattern on the polysilicon layer such that a portion of the polysilicon layer placed on the active region between the field oxide films is exposed; performing a second N⁺ ion implantation process in the polysilicon layer using the second photoresist pattern as a mask; removing the second photoresist pattern; and subjecting the resulting substrate to a thermal diffusion process. The method allows poly depletion effect to be minimized, thereby ensuring stable threshold voltage and reducing actual failure rate.

7 Claims, 3 Drawing Sheets

(a)

(b)

METHOD FOR FABRICATING DUAL-GATE SEMICONDUCTOR DEVICE

BACKGROUND OF THE INVENTION

1. Field of the Invention

The present invention relates to a method for fabricating a dual-gate semiconductor device, and more particularly to a method for fabricating a dual-gate CMOS device, which allows poly depletion effect to be minimized.

2. Description of the Prior Art

As the size of semiconductor devices becomes smaller, three-dimensional poly depletion effect occurs. To minimize this poly depletion effect, poly-Si doping needs to be increased.

As used herein, the term "three-dimensional poly depletion effect means that the depletion caused by vertical electric fields in a gate due to insufficient poly-Si doping, and the gate length-direction depletion resulting from fringing electric fields at the gate corner, and also the gate width-direction depletion caused by an increase in poly thickness of the STI edge when effective fox height is higher than zero, appear in a composite manner.

The poly depletion effect results in an increase in threshold voltage (Vt), a reduction in current and an increase in variation of Vt, and also can act as the main cause of low Vcc soft bit fail in the case of FCMOS SRAM.

This poly depletion effect can be effectively minimized by increasing the dose or energy of $N^+$ ion implantation into poly-Si. However, the increase of $N^+$ ion implantation dose disadvantageously causes the curing of photoresist (PR) used as a mask after ion implantation, so that PR residues remain even after a removal process of PR.

Furthermore, the increase of $N^+$ ion implantation energy is a way of implanting a sufficient amount of impurity ions to the bottom of poly-Si (near a boundary with a gate insulting film) so as to minimize the poly depletion effect. However, excessively high implantation energy causes so-called "penetration" where impurity ions penetrate poly-Si into a channel region under the poly-Si to cause a reduction in Vt and an increase in variation of Vt. Thus, since the increase of ion implantation energy has risk, the amount of a suitable increase in ion implantation energy needs to be selected.

SUMMARY OF THE INVENTION

Accordingly, the present invention has been made to solve the above-mentioned problems occurring in the prior art, and an object of the present invention is to provide a method for fabricating a dual-gate semiconductor device, which allows poly depletion effect to be minimized, thereby ensuring stable threshold voltage and minimizing actual failure rate.

To achieve the above object, the present invention provides a method for fabricating a dual-gate semiconductor device, the method comprising the steps of: forming field oxide films defining an active region and a field region on a semiconductor substrate; forming a polysilicon layer on the semiconductor substrate having the field oxide films formed therein; a first photoresist pattern on the semiconductor substrate such that a portion of the polysilicon layer placed on the active region between the field oxide films is exposed; performing a first $N^+$ ion implantation process in the polysilicon layer using the first photoresist pattern as a mask; removing the first photoresist pattern; forming a second photoresist pattern on a portion of the polysilicon layer such that a portion of the polysilicon layer placed on the active region between the field oxide films is exposed; performing a second $N^+$ ion implantation process in the polysilicon layer using the second photoresist pattern as a mask; removing the second photoresist pattern; and subjecting the resulting substrate to a thermal diffusion process.

BRIEF DESCRIPTION OF THE DRAWING

The above and other objects, features and advantages of the present invention will be more apparent from the following detailed description taken in conjunction with the accompanying drawings, in which:

FIG. 2A shows a wafer where $N^+$ ion implantation into a polysilicon layer was conducted at ion implantation dose and energy according to the prior art. FIG. 2B shows a wafer where $N^+$ ion implantation into a polysilicon layer was conducted at ion implantation dose and energy according to an embodiment of the present invention.

DETAILED DESCRIPTION OF THE PREFERRED EMBODIMENTS

Hereinafter, a method for fabricating a dual-gate semiconductor device according to the present invention will be described with reference to the accompanying drawings.

FIGS. 1A to 1E are cross-sectional views for describing a method for fabricating a dual-gate semiconductor device according to a preferred embodiment of the present invention.

Figure 1A:
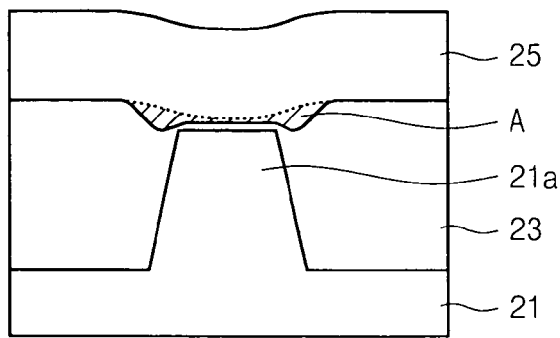
FIGS. 1A to 1E are cross-sectional views for describing a method for fabricating a dual-gate semiconductor device according to a preferred embodiment of the present invention.

As shown in FIG. 1A, a trench (not shown) is formed in a semiconductor substrate 21, and then, field oxide films 23 providing the insulation between devices are formed in the trench.

Next, a gate insulating film (not shown) is formed on the semiconductor substrate 21 having the field oxide films 23 formed therein, after which a polysilicon layer 25 is deposited on the resulting substrate. The polysilicon layer 25 is formed of undoped amorphous silicon and deposited to a thickness of about 2,000 Å. Furthermore, in depositing the polysilicon layer 25, a portion A of the polysilicon layer 25, which is placed on an active region 21a and a portion of the field oxide films forming a boundary with the active region 21a, is deposited to a larger thickness than other portions, i.e., portions of the polysilicon layer 25 which are placed on the field oxide films 23.

Figure 1B:
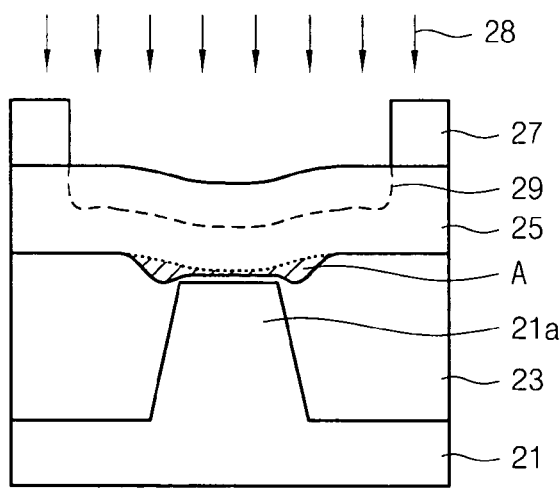

Then, as shown in FIG. 1B, a photoresist layer is applied on the polysilicon layer 25, and selectively removed by exposure to light and development according to a photolithography process. Thus, a first photoresist pattern 27 is formed such that a portion A of the polysilicon layer 25, which is placed on an active region 21a and a portion of the field oxide films forming a boundary with the active region 21a, is exposed.

Subsequently, a first $N^+$ ion implantation process in the polysilicon layer 25 is performed using the first photoresist pattern 27 as a mask, thereby forming a first impurity region 29. In this implantation process, phosphorus ions are implanted at a dose of about $5\times10^{15}/cm^2$ and an energy of about 40 KeV such that the curing of the first photoresist pattern is prevented.

Figure 1C:
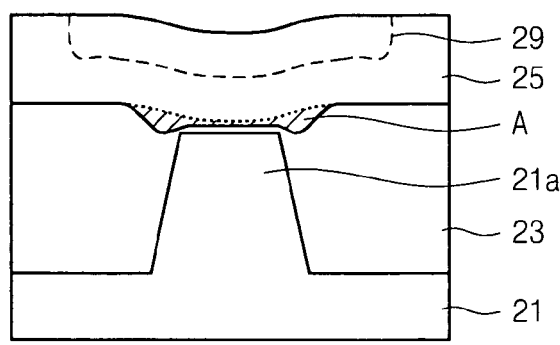
Figure 1D:
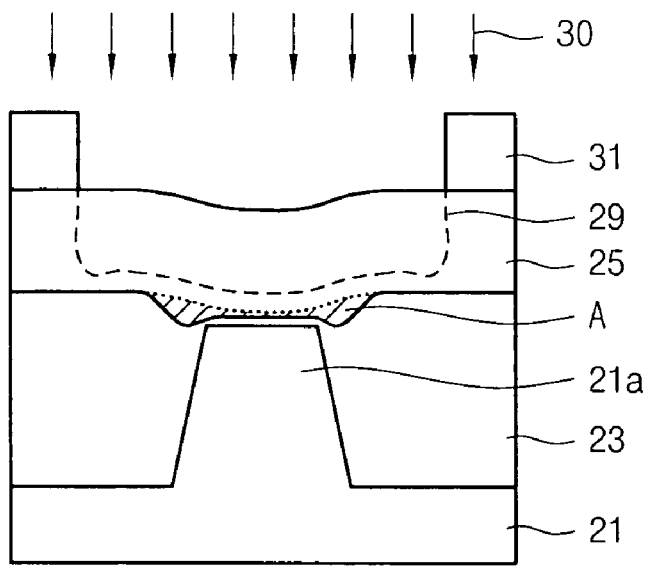
Figure 1E:
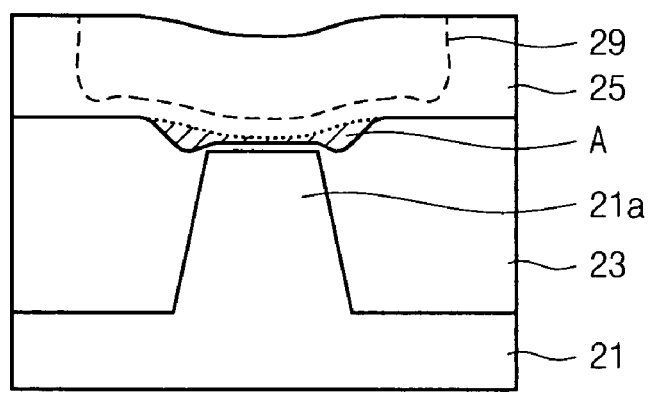

As shown in FIGS. 1C and 1D, the first photoresist pattern 27 is then removed. Next, a photoresist layer is applied on the polysilicon layer 25, and selectively removed by exposure to light and development according to a photolithography process. Thus, a second photoresist pattern 31 is formed such that a portion A of the polysilicon layer 25, which is placed on an active region 21a and a portion of the field oxide films forming a boundary with the active region 21a, is exposed.

Subsequently, a second N+ ion implantation process in the first impurity region 29 of the polysilicon layer 25 is performed using the second photoresist pattern 31 as a mask. The second N+ ion implantation process is performed under the same conditions as the first N+ ion implantation process. Namely, in the second N+ ion implantation process, phosphorus ions are implanted at a dose of about $5 \times 10^{15}/cm^2$ and an energy of about 40 KeV.

Subsequently, the resulting substrate is subjected to a thermal diffusion process at about 800° C.

Meanwhile, in another embodiment of the present invention, a one-step N+ ion implantation process is performed at increased ion implantation energy. The effect of this embodiment on yield increase can be found in FIGS. 2A and 2B.

Figure 2:
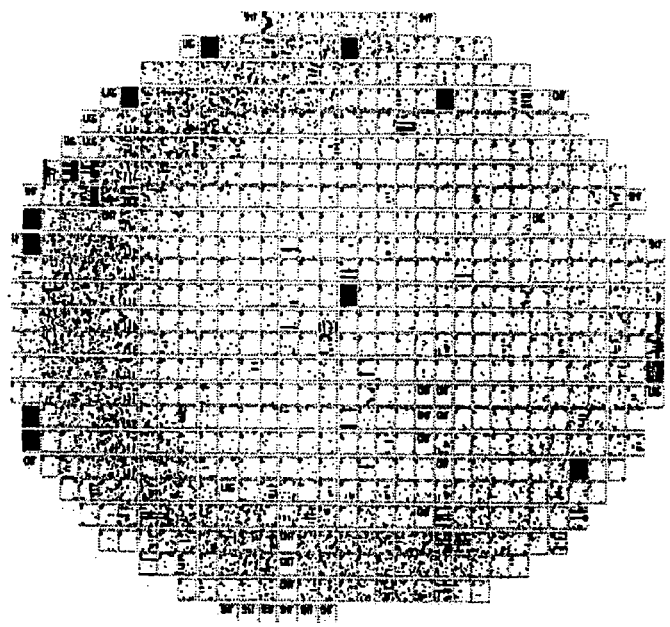
FIGS. 2A and 2B show the comparison of bit failure between semiconductor wafers.
Figure 2:
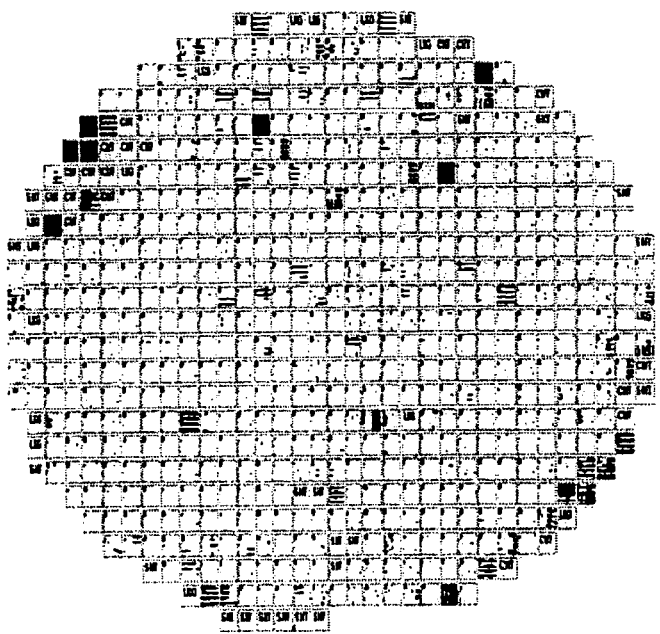

FIGS. 2A and 2B shows the comparison of bit failure between wafers where N+ ion implantation was performed under different conditions. FIG. 2A shows a wafer where N+ ion implantation into a polysilicon layer was performed in one step at a dose of about $5 \times 10^{15}/cm^2$ and an energy of about 40 KeV according to the prior art. FIG. 2 shows a wafer where N+ ion implantation into a polysilicon layer was performed in one step at a dose of about $5 \times 10^{15}/cm^2$ and an energy of about 50 KeV according to the present invention.

As shown in FIGS. 2A and 2B, it could be found that the wafer of FIG. 2B where an energy of about 50 KeV was used had reduced soft bit failure at its edge.

Moreover, a yield of 5.4% was obtained in the wafer of FIG. 2A whereas a yield of 85% was obtained in the wafer of FIG. 2B where increased ion implantation energy was used. Thus, this increase in ion implantation energy resulted in 79.4% increase in yield.

As described above, in one embodiment of the method for fabricating the dual-gate semiconductor device according to the present invention, N+ ion implantation is performed in two steps at a dose of about $5 \times 10^{15}/cm^2$ per ion implantation step such that the curing of a photoresist film does not occur. Moreover, the N+ ion implantation is performed at a total dose of $1 \times 10^{16}/cm^2$ so that poly-Si depletion effect can be minimized.

Thus, the problem of the curing of a photoresist film in the N+ ion implantation process can be solved by the present invention, so that high yield can be stably obtained.

In another embodiment of the present invention, N+ ion implantation is performed in one step at increased ion implantation energy (e.g., about 50 KeV when phosphorus ions are implanted at a dose of $5 \times 10^{15}/cm^2$) such that the concentration of impurities near the boundary between the polysilicon layer and the gate insulating film is increased.

Thus, in this alternative embodiment, the curing of a photoresist film resulting from an increase in impurity concentration does not occur, and thus, N+ ion implantation does not need to be performed in two separate steps so that a process can be simplified.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a dual-gate semiconductor device, the method comprising the steps:
    forming field oxide films defining an active region and field region on a semiconductor substrate;
    forming a polysilicon layer on the semiconductor substrate having the field oxide films formed therein;
    forming a first photoresist pattern on the semiconductor substrate such that a portion of the polysilicon layer placed on the active region between the field oxide films is exposed;
    performing a first N+ ion implantation process in the polysilicon layer using the first photoresist pattern as a mask;
    removing the first photoresist pattern;
    forming a second photoresist pattern on the polysilicon layer such that the same portion of the polysilicon layer to which the first N+ ion implantation process is performed is exposed;
    performing a second N+ ion implantation process in same portion of the polysilicon layer to which the first N+ ion implantation process is performed using the second photoresist pattern as a mask;
    removing the second photoresist pattern; and
    subjecting the resulting substrate to a thermal diffusion process.

2. The method of claim 1, wherein the polysilicon layer is deposited to a thickness of about 2,000 Å.

3. The method of claim 1, wherein the first N+ ion implantation process comprises implanting phosphorous ions into the polysilicon layer at a dose of about $5 \times 10^{15}/cm^2$ and an energy of about 40 Key.

4. The method of claim 1, wherein the second N+ ion implantation process comprises implanting phosphorous ions into the polysilicon layer at a dose of about $5 \times 10^{15}/cm^2$ and an energy of about 40 KeV.

5. The method of claim 1, wherein the total dose of ions planted during the first and second ion implantation processes is less than $1 \times 10^{16}/cm^2$.

6. The method of claim 1, wherein the thermal diffusion process is conducted at a temperature above 800° C.

7. The method of claim 1, wherein the polysilicon layer is formed of undoped amorphous silicon.

* * * * *